United States Patent
Fukuhara et al.

(10) Patent No.: US 7,719,578 B2
(45) Date of Patent: May 18, 2010

(54) IMAGE PICKUP APPARATUS, IMAGE PICKUP ELEMENT, AND METHOD FOR CONTROLLING IMAGE PICKUP APPARATUS

(75) Inventors: Takahiro Fukuhara, Kanagawa (JP); Tadakuni Narabu, Kanagawa (JP)

(73) Assignee: Sony Corporation, Tokyo (JP)

( * ) Notice: Subject to any disclaimer, the term of this patent is extended or adjusted under 35 U.S.C. 154(b) by 412 days.

(21) Appl. No.: 11/630,005

(22) PCT Filed: Jun. 22, 2006

(86) PCT No.: PCT/JP2005/011885

§ 371 (c)(1),
(2), (4) Date: Dec. 19, 2006

(87) PCT Pub. No.: WO2006/003906

PCT Pub. Date: Jan. 12, 2006

(65) Prior Publication Data

US 2008/0062281 A1    Mar. 13, 2008

(30) Foreign Application Priority Data

Jul. 1, 2004    (JP) .............................. 2004-195298

(51) Int. Cl.
 H04N 5/235    (2006.01)
(52) U.S. Cl. .................. 348/229.1; 348/230.1
(58) Field of Classification Search .............. 348/14.12, 348/221.1, 229.1, 262–324, 362–366, 230.1
See application file for complete search history.

(56) References Cited

U.S. PATENT DOCUMENTS

| | | | | |
|---|---|---|---|---|
| 5,619,265 A | * | 4/1997 | Suzuki et al. | 348/362 |
| 6,903,776 B1 | * | 6/2005 | Tsujino et al. | 348/362 |
| 2002/0003576 A1 | | 1/2002 | Konishi et al. | |
| 2003/0214595 A1 | * | 11/2003 | Mabuchi | 348/294 |
| 2004/0095495 A1 | | 5/2004 | Inokuma et al. | |

FOREIGN PATENT DOCUMENTS

| | | |
|---|---|---|
| JP | 07-221461 | 8/1995 |
| JP | 09-163193 | 6/1997 |
| JP | 2000-350059 | 12/2000 |
| JP | 2001-352471 | 12/2001 |
| JP | 2003-234967 | 8/2003 |
| JP | 2004-031785 | 1/2004 |
| JP | 2004-064559 | 2/2004 |
| JP | 2004-112360 | 4/2004 |
| JP | 2004-146816 | 5/2004 |

\* cited by examiner

*Primary Examiner*—Tuan Ho
*Assistant Examiner*—Don Nguyen
(74) *Attorney, Agent, or Firm*—Finnegan, Henderson, Farabow, Garrett & Dunner, L.L.P.

(57) ABSTRACT

The present invention relates illustratively to a video camera for recording image pickup results constituting moving pictures, an electronic still camera, and a monitoring apparatus. The invention envisages varying the charge storage time TE or the frame period of image pickup means 3 or the processing time TC of data compressing means 8 in accordance with the processing time TC of the data compressing means 8.

24 Claims, 10 Drawing Sheets

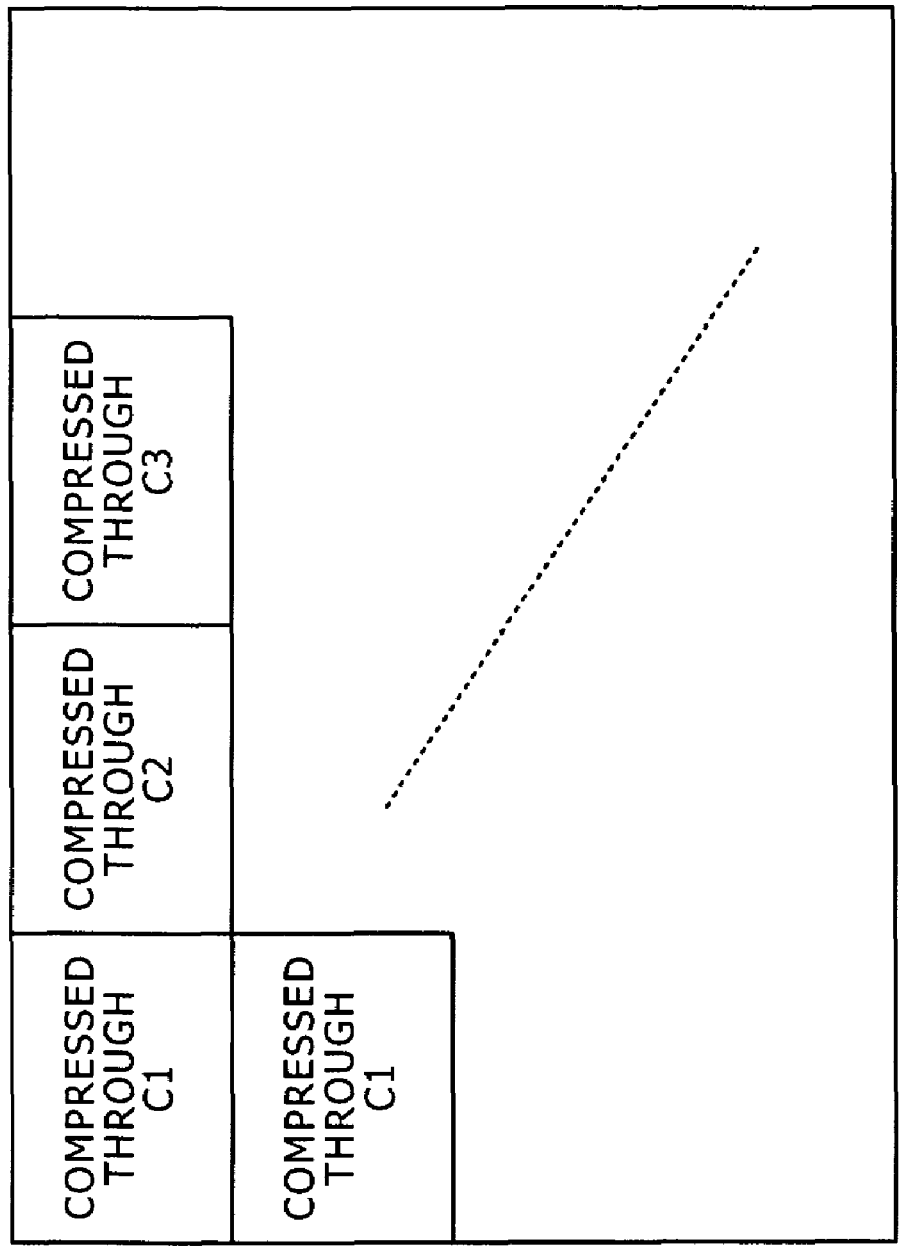

IMAGE PICKUP APPARATUS, IMAGE PICKUP ELEMENT, AND METHOD FOR CONTROLLING IMAGE PICKUP APPARATUS

BACKGROUND OF THE INVENTION

1. Technical Field

The present invention relates to an image pickup apparatus, an image pickup element, and a method for controlling the image pickup apparatus. Illustratively, the invention may apply to a video camera for recording image pickup results constituting moving pictures, an electronic still camera, and a monitoring apparatus. This invention envisages varying the charge storage time or the frame period of image pickup means or the processing time of data compressing means in accordance with the processing time of the data compressing means so that when image pickup results are acquired at a high frame frequency for recording and transmission, the acquired image pickup results are compressed reliably.

2. Background Art

Heretofore, CCD (Charge Coupled Device) solid-state image pickup elements have been used in video cameras to acquire image pickup results at a 1/60 second field frequency through field readout. The image pickup results are compressed before being recorded to recording media such as optical disks. Such video cameras typically provide the so-called electronic shutter capability by controlling the charge storage time of their image sensors, whereby an object moving at high speed is imaged with high image quality.

In recent years, CMOS solid-state image pickup elements have been introduced for practical use. Illustratively, Japanese Patent Laid-open No. 2004-31785 proposes a configuration integrating a CMOS solid-state image pickup element with its peripheral circuits.

The CMOS solid-state image pickup element typically acquires image pickup results at transfer rates of as high as hundreds of frames per second. During image pickup, a more realistic effect than has been possible so far is typically gained using the CMOS solid-state image pickup element or a speed-enhanced CCD solid-state image pickup element providing image pickup results at high frame frequencies.

However, when image pickup results are acquired at such high frame frequencies, the amount of the data to be recorded and transferred increases dramatically. The process of data compression then cannot keep up with other processes, disrupting the image pickup processing as a whole.

DISCLOSURE OF INVENTION

The present invention has been made in view of the above circumstances and provides an image pickup apparatus, an image pickup element, and a method for controlling the image pickup apparatus such that when image pickup results are acquired at a high frame frequency for recording and transmission, the acquired image pickup results are compressed reliably.

In carrying out the present invention, according to one embodiment of the present invention, an image pickup apparatus includes: image pickup means for outputting image pickup results through activation of a driving circuit; data compressing means for compressing the image pickup results output by the image pickup means before outputting the compressed image pickup results; and controlling means for varying the charge storage time or the frame period of the image pickup means or the processing time of the data compressing means in accordance with the processing time required by the data compressing means for compressing the image pickup results.

Formed by the image pickup means for outputting image pickup results through activation of a driving circuit; by the data compressing means for compressing the image pickup results output by the image pickup means before outputting the compressed image pickup results; and by the controlling means for varying the charge storage time or the frame period of the image pickup means or the processing time of the data compressing means in accordance with the processing time required by the data compressing means for compressing the image pickup results, the image pickup apparatus according to the present invention offers the following major benefits: it prevents dropping frames when images represented by the image pickup results are complicated and expected to require a longer time for processing. Conversely, when images represented by the image pickup results have few movements (i.e., solid images) and are expected to require a shorter time for processing, the inventive image pickup apparatus increases the frame frequency of the image pickup results so as to record and transmit images of a more realistic effect. In this manner, when image pickup results are acquired at a high frame frequency for recording and transmission, the image pickup apparatus can compress the image pickup results reliably.

According to another embodiment of the present invention, an image pickup element includes: image pickup means for outputting image pickup results through activation of a driving circuit; data compressing means for compressing the image pickup results output by the image pickup means before outputting the compressed image pickup results, the image pickup means and the data compressing means being formed integrally; and at least part of controlling means for varying the charge storage time or the frame period of the image pickup means or the processing time of the data compressing means in accordance with the processing time required by the data compressing means for compressing the image pickup results.

When image pickup results are acquired at a high frame frequency for recording and transmission, the image pickup element of the above-outlined configuration according to the present invention can compress the image pickup results reliably.

According to a further embodiment of the present invention, a method for controlling an image pickup apparatus includes: image pickup means for outputting image pickup results through activation of a driving circuit; and data compressing means for compressing the image pickup results output by the image pickup means before outputting the compressed image pickup results, the data compressing means for varying the charge storage time or the frame period of the image pickup means or the processing time of the data compressing means in accordance with the processing time required by the data compressing means for compressing the image pickup results.

When image pickup results are acquired at a high frame frequency for recording and transmission, the above-outlined method of the present invention for controlling the image pickup apparatus can compress the image pickup results reliably.

According to the embodiment of the present invention, it is possible to compress image pickup results reliably when these results are acquired at a high frame frequency for recording and transmission.

BRIEF DESCRIPTION OF DRAWINGS

FIG. 10 is a plan view explanatory of channels through which data compressing means compresses data.

BEST MODE FOR CARRYING OUT THE INVENTION

The preferred embodiments of the present invention will now be described in detail with reference to the accompanying drawings.

(1) Configuration of the First Embodiment

Figure 1:
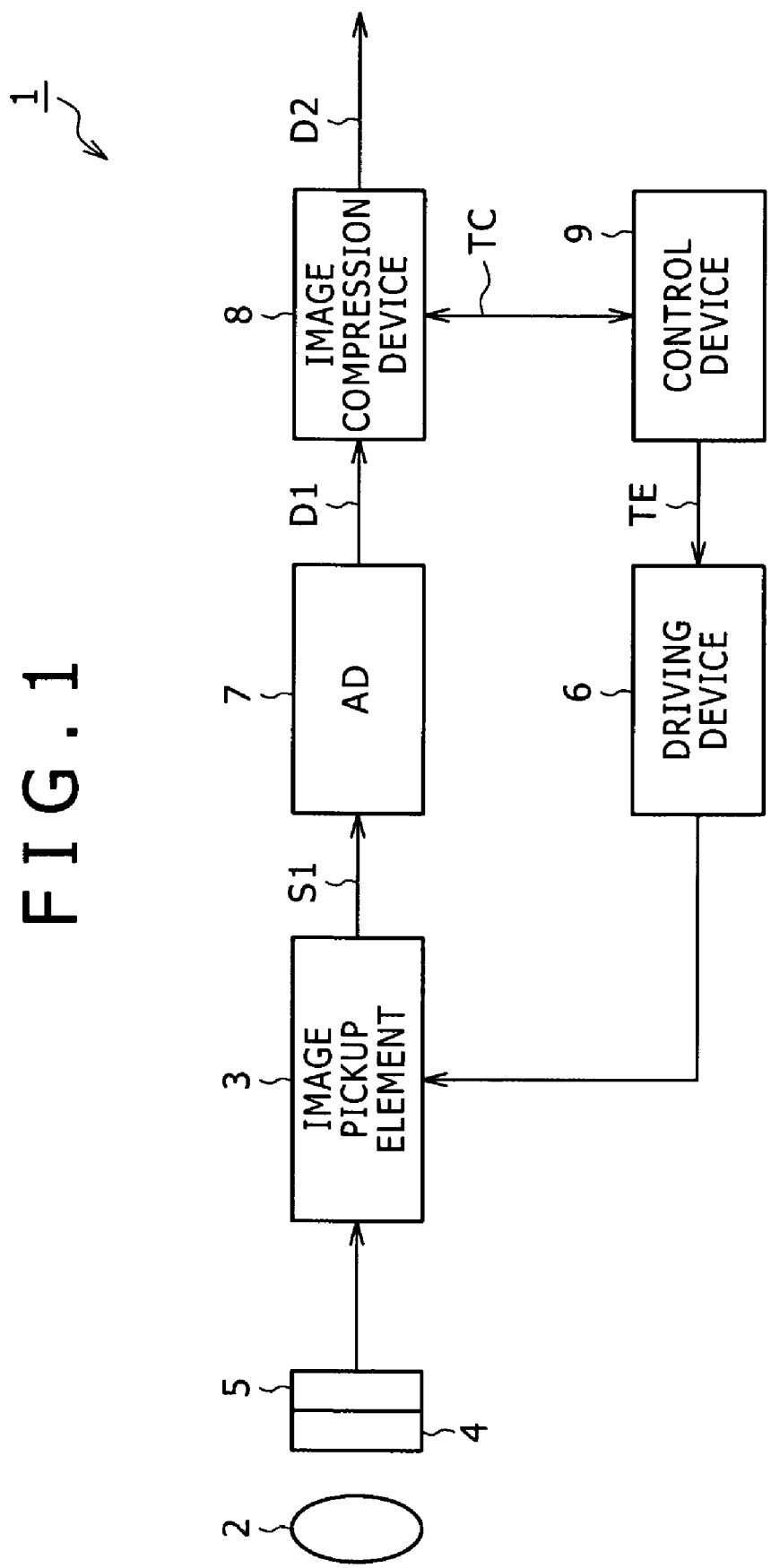
FIG. 1 is a block diagram showing an image pickup apparatus practiced as a first embodiment of the present invention.

FIG. 1 is a block diagram showing an image pickup apparatus practiced as the first embodiment of the present invention. The image pickup apparatus 1 compresses image pickup results of a desired object being imaged, records the compressed image pickup results to a recording medium, and/or transmits the results to a desired destination.

In the image pickup apparatus 1, a lens 2 has its magnification and aperture varied in response to the user's control operation so as to focus incident light onto an image pickup area of an image pickup element 3. An optical low-pass filter 4 prevents optical components having a spatial frequency higher than that of the outgoing light from the lens 2. A color correction filter 5 located downstream corrects the color temperature of the outgoing light emitted from the optical low-pass filter 4, and then emits the light.

The image pickup element 3 is constituted illustratively by a CMOS solid-state image pickup element. Activated by timing signals output from a driving device 6, the image pickup element 3 has an optical image formed on its image pickup area and submits the image to photoelectric conversion by pixels to generate an image pickup signal S1 for output. During the process, the image pickup element 3 photoelectrically converts the incident light through the pixels and stores the results of the conversion per pixel for a predetermined charge storage time per frame. At the end of the charge storage time, the results of the photoelectric conversion stored per pixel are transferred for output by the image pickup signal S1. At the same time, the photoelectric conversion of the next frame is started. In this manner, the image pickup element 3 outputs the image pickup results taken at a frame frequency corresponding to the charge storage time in effect. The image pickup results are typically output at frame frequencies higher than those of video signals in related art.

The driving device 6 under control of a control device 9 generates various timing signals and outputs them to the image pickup element 3. The image pickup element 3 is thus controlled in operation by the control device 9. In this control setup, the driving signal 6 outputs timing signals such that the charge storage time of the image pickup element 3 becomes equal to a charge storage time TE designated by the control device 9. With the first embodiment, the charge storage time TE is controlled by the control device 9, and the driving device 6 varies a frame period of image pickup results. The frame period equals the period of one frame.

An analog-to-digital conversion circuit (AD) 7 converts the image pickup signal S1 from analog to digital form and thereby outputs image data D1. The image pickup apparatus 1 subjects the image data D1 to a signal processing circuit, not shown, for pixel interpolation process, color space conversion process, edge enhancement process, and noise reduction process. The processed data is input to an image compression device 8.

The image compression device 8 compresses the image data D1 and outputs compression-encoded data D2 to recording and transmission sections. In the image pickup apparatus 1, the recording section records the encoded data D2 to a predetermined recording medium, and the transmission section transmits the encoded data D2 to external equipment. During the data compression process, the image compression device 8 compresses the data illustratively using the MPEG standard on a predetermined quantization scale designated by the control device 9. In accordance with the degree of difficulty in encoding the image data D1, the image compression device 8 varies the time required for the encoding process so as to generate the encoded data D2 of constant image quality. The image compression device 8 detects a processing time TC required for compressing the image data D2 per picture and notifies the control device 9 of the detected processing time TC.

The control device 9 is composed of processing means constituting a microcomputer running under a predetermined control program. In response to the user's control operations, the control device 9 controls the performance of the image pickup apparatus 1 as a whole. With the first embodiment, the control program is offered preinstalled in the image pickup apparatus 1. Alternatively, the control program may be downloaded over a network such as the Internet or from a wide range of suitable recording media including an optical disk and a memory card or the like.

The control device 9 starts operating when switched on by the user. Responding to the user's control operations, the control device 9 controls the performance of the entire apparatus in such a manner as to start acquiring image pickup results from the image pickup element 3 and to initiate recording and transmission of the acquired image pickup results. With the acquisition, recording, and transmission of the image pickup results thus started, the control device 9 varies the speed at which to process the image data D1 in accordance with the processing time TC detected by the image compression device 8. In this manner, the control device 9 prevents dropping frames in the encoded data D2 and thereby compresses the image pickup results reliably even when the image pickup results are acquired at a high frame frequency before being recorded and transmitted.

More specifically, if the user selects data compression preference mode with the first embodiment, the control device 9 varies the charge storage time TE of the image pickup element 3 in accordance with the processing time TC of the image compression device 8 so as to prevent dropping frames in the encoded data D2. That is, it might happen that the processing time TC of the image compression device 8 is prolonged because of the image data D1 constituting a complex image, with the processing time TC becoming longer than the charge storage time TE. In such a case, the charge storage time TE is prolonged in such a manner as to prevent dropping frames in the encoded data D2.

Conversely, it might happen that the image constituted by the image data D1 has few movements (i.e., solid image) so that the processing time TC of the image compression device 8 is shortened. In that case, the charge storage time TE is shortened in order to record an image of a highly realistic effect based on a high frame frequency. If the user designates data compression mode while data compression preference mode is still in effect, the control device 9 controls the data compression preference mode while adjusting the image compression device 8 in such a manner as to compress target data typically in accordance with a quantization scale of the designated data compression mode.

Meanwhile, if the user selects frame rate preference mode, the control device 9 varies the processing speed TC of the image compression device 8 in a manner recording the image data D1 at a user-designated frame period. That is, with the charge storage time TE of the image pickup element 3 controlled so as to output the image data D1 at the user-designated frame period, it might happen that the image constituted by the image data D1 is so complex as to require prolongation of the processing time TC of the image compression device 8. If the processing time TC is thus found longer than the charge storage time TE, the control device 9 shortens the processing time TC of the image compression device 8 in order to prevent dropping frames in the encoded data D2.

Conversely, it might happen that the image constituted by the image data D1 has few movements (solid image) so that the processing time TC of the image compression device 8 becomes short. In that case, the processing time TC of the image compression device is prolonged in order to record an image of a highly realistic effect based on a high frame frequency. In this control setup, the control device 9 varies the processing time TC by changing the clock frequency serving as an operational reference for the image compression device 8. Alternatively, or additionally, the processing time TC may be varied by changing the quantization scale in use.

(2) Operation of the First Embodiment

With the above-described configuration in place, the image pickup apparatus 1 gets the lens 2 to form an image of an object onto the image pickup area of the image pickup element 3. The image pickup results constituting the image are output by the image pickup element 3 and converted into the image data D1 by the analog-to-digital conversion circuit 7. The image data D1 undergoes edge enhancement process and other processes before being compression-encoded by the image compression device 8 into encoded data D2. The encoded data D2 is recorded to a suitable recording medium and transmitted to external equipment. In this manner, the image pickup apparatus 1 compresses image pickup results and records and transmits the compressed results.

In the series of processes described above, the time it takes the image compression device 8 to compress the image data D1 is measured as the processing time TC. The processing time TC is compared with the charge storage time TE of the image pickup element 3. The outcome of the comparison is used as the basis for varying the processing speed of relevant components. That is, when the image constituted by the image data D1 is so complex as to entail the processing time TC of the image processing device 8 being longer than the charge storage time TE, the processing speed of the relevant components is so varied as to prevent the processing time TC from generating dropping frames in the encoded data D2. Conversely, if the image of image data D1 has few movements (solid image) so that the processing time TC of the image processing device 8 becomes shorter than the charge storage time TE, the processing speed of the relevant components is also varied to acquire and record an image of a highly realistic effect.

If the user selects data compression preference mode with the first embodiment, the charge storage time of the image pickup element 3 is set to be varied to control the speed of data compression. When the processing time TC of the image compression device 8 is found longer than the charge storage time TE of the image pickup element 3, the charge storage time TE is prolonged in a manner preventing dropping frames in the encoded data D2, whereby the frame frequency for the image data D1 is lowered. If the processing time TC of the image compression device 8 is found shorter than the charge storage time TE, the charge storage time TE of the image pickup element 3 is shortened in such a manner as to raise the frame frequency for the image data D1.

As described, where image pickup results are to be acquired at a high frame frequency for recording and transmission, the first embodiment can compress the image pickup results unfailingly before recording the compressed results to a suitable recording medium or sending them to the outside.

Where the user selects frame rate preference mode, the image compression device 8 is set to be controlled to adjust its processing speed. That is, the processing speed TC of the image compression device 8 is varied in such a manner as to prevent dropping frames while compressing the data at the highest possible image quality. In this case, too, the image pickup results acquired at a high frame frequency can be compressed reliably before being recorded to the appropriate recording medium or transmitted to the outside.

(3) Effects of the First Embodiment

The configuration of first embodiment as described above varies the charge storage time of the image pickup element in accordance with the time it takes to compress data, or varies the data compression time itself. This makes it possible to acquire image pickup results at a high frame frequency and to compress the acquired results unfailingly before recording the compressed results to the appropriate recording medium or sending them to external equipment.

When the processing time is found longer than the charge storage time, the image pickup element as image pickup means is controlled in operation in such a manner as to prevent dropping frames, whereby the image pickup results are processed reliably.

Alternatively, when the processing time is found longer than the charge storage time, the processing speed of the image compression device as data compressing means may be controlled so as to shorten the processing time. This also prevents dropping frames and allows the image pickup results to be processed unfailingly.

The processing time of the data compressing means may be varied by changing clocks of the data compressing means. This allows the image pickup results to be processed reliably without any wasteful increase in power consumption.

(4) Second Embodiment

Figure 2:
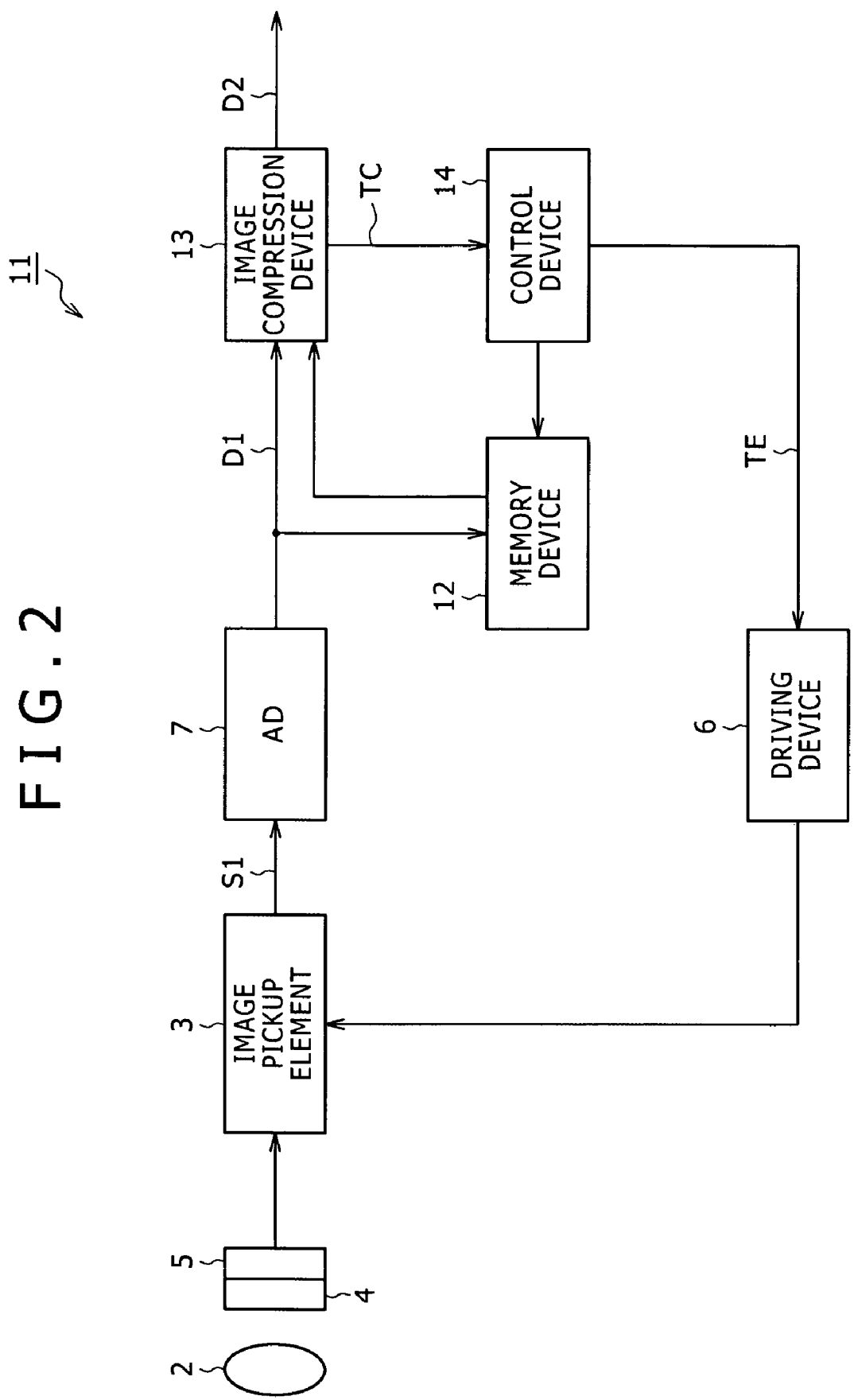
FIG. 2 is a block diagram showing an image pickup apparatus practiced as a second embodiment of the present invention.

FIG. 2 is a block diagram showing an image pickup apparatus practiced as the second embodiment of the present invention. In this image pickup apparatus 11, a memory device 12 is located on the input side of the image compression device 8. An image compression device 13 and a control device 14 replace the image compression device 8 and control device 9 of the first embodiment respectively. The rest of the configuration of the second embodiment is substantially the same as the first embodiment. In FIG. 2, the components having identical or corresponding functions to their counterparts in FIG. 1 are designated by like reference symbols, and their descriptions are omitted where redundant.

In the image pickup apparatus 11, the memory device 12 is formed to accommodate image data D1 constituting a plurality of frames. Under control of the control device 14, the memory device 12 stores the successively input image data D1 and outputs the stored data to the image compression device 13.

Under control of the control device 14 as in the case of the image compression device 8 in the image pickup apparatus 1, the image compression device 13 compresses the successively input image data D1 into encoded data D2 for output to recording and transmission sections. During the process, the image compression device 13 admits the image data D1 either directly from the analog-to-digital conversion circuit 7 or by way of the memory device 12 before compressing the input image data D1. In this manner, the image pickup apparatus 11 uses the memory device 12 as a buffer memory that absorbs adverse effects incurred by fluctuations of the processing time TC for data compression, and then process the image data D1.

As with the control device 9, the control device 14 controls the overall performance of the image pickup apparatus 11. During the process, depending on the processing time TC detected from the image compression device 8, the control device 14 causes the image compression device 13 selectively to handle either the image data D1 input directly from the analog-to-digital conversion circuit 7 or the image data D1 input through the memory device 13. This allows the image compression device 13 steadily to compress the image data D1 at high image quality without dropping frames when the processing time TC for data compression is varied.

Figure 3:
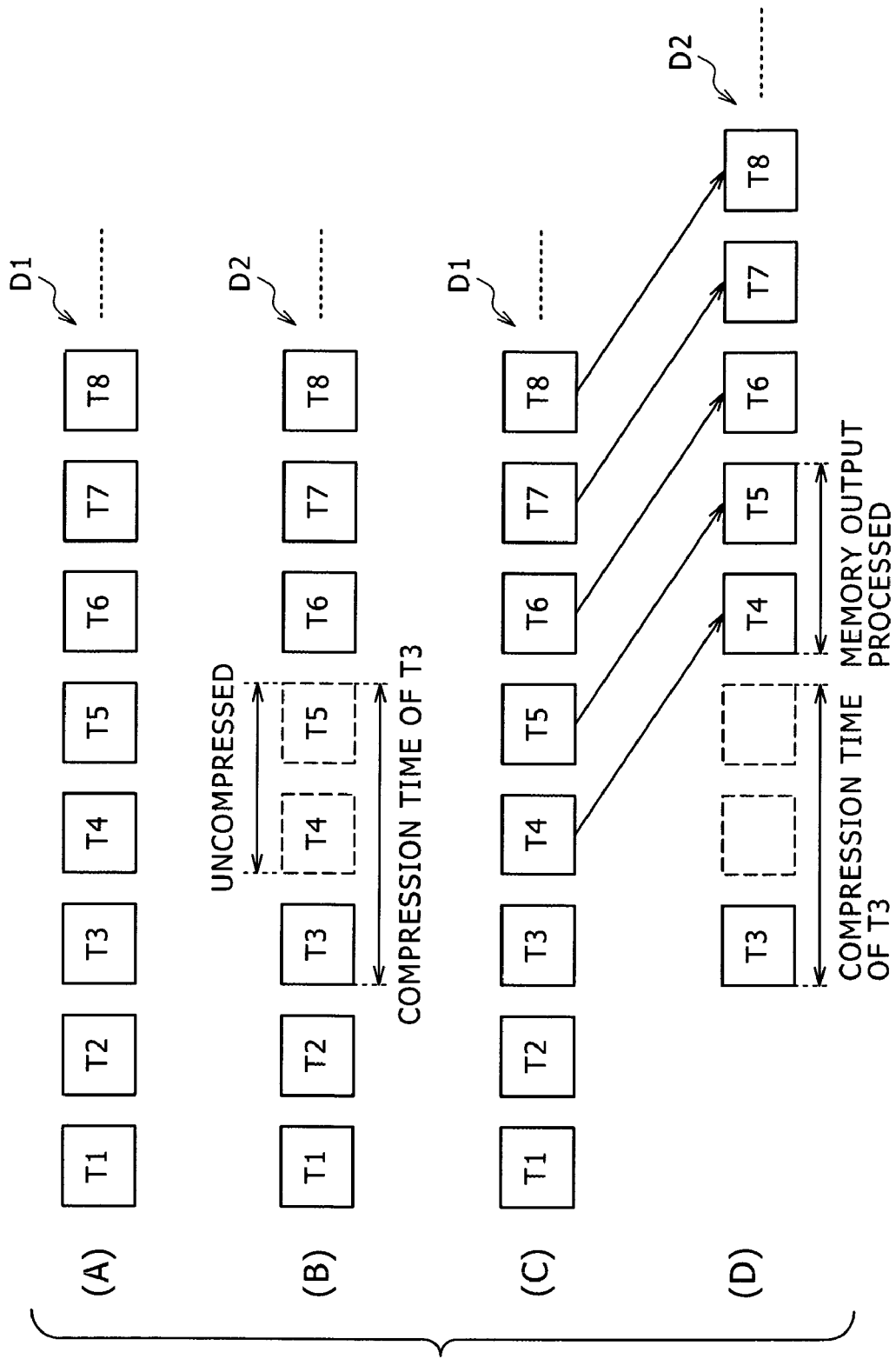
FIG. 3(A), FIG. 3(B), FIG. 3(c), and FIG. 3(D) are timing charts explanatory of how the image pickup apparatus of FIG. 2 works.

As shown in FIG. 3(A), it might happen that where pictures T1, T2, T3, etc., are successively input, it takes a processing time TC equivalent to three frames to compress the picture T3. In that case, as shown in FIG. 3(B), there is no time to compress the subsequent pictures T4 and T5 which make up dropping frames in the encoded data D2.

Between the picture T1 and the picture T3, as shown in FIG. 3(C) and FIG. 3(D), the control device 14 controls the image compression device 8 in operation in such a manner as to compress the image data D1 input directly from the analog-to-digital conversion circuit 7. From the picture T4 on, the control device 14 controls the image compression device 8 in a manner compressing the image data D1 held temporarily in the memory device 12. In this case, the control device 14 controls the memory device 12 in operation in a manner temporarily accommodating the picture T4 and subsequent pictures while causing the image compression device 13 to process the temporarily stored image data D1 in the memory device 12.

When the control device 14 controls the image compression device 8 in operation in a manner compressing the image data D1 temporarily stored in the memory device 12, the processing time of the image compression device 13 is eventually made short enough for the device 13 to catch up with the image data D1 being output directly from the image pickup element 3. At this point, the control device 14 causes the image compression device 8 to start compressing the image data D1 input directly from the analog-to-digital conversion circuit 7 instead of dealing with the data D1 held temporarily in the memory 12. That is, the control device 14 controls the image compression device 8 in such a manner as to stop recording the image data D1 up to a certain picture in the memory device 12 and to start processing the image data D1 input directly from the analog-to-digital conversion circuit 7.

The control device 14 utilizes the memory device 12 to prevent dropping frames attributable to the fluctuation in the processing time TC of the image compression device 13, thereby processing the image data D1 at high image quality. When the use of the memory device 12 is no longer sufficient to prevent dropping frames, the control device 14 prolongs the charge storage time TE of the image pickup element 3 or shortens the processing time TC of the image compression device 13 so as to prevent dropping frames as in the case of the first embodiment. Conversely, if the output of the image data from the image pickup element 3 fails to keep up with the processing of the image compression device 13, the control device 14 shortens the charge storage time TE of the image pickup element 3 or prolongs the processing time of the image compression device 13 in order to process the image data D1 at the highest possible image quality, as in the case of the first embodiment.

The second embodiment of the above-described configuration varies the charge storage time of the image pickup means or the processing time of the data compressing means in accordance with the processing time of the data compressing means. Depending on the processing time of the data compressing means, the second embodiment stores temporarily the image pickup results output by the image pickup means before getting the results compressed by the data compressing means. The data compressing means is thus arranged to absorb the fluctuation in the processing time. Where image pickup results are to be acquired at a high frame frequency for recording and transmission, the second embodiment can compress the image pickup results unfailingly and record the compressed results to the appropriate recording medium and send them to the outside.

(5) Third Embodiment

The third embodiment is arranged to control the sampling number of image data output from the image pickup element in such a manner as to vary the processing speed of the data compressing means, thereby preventing dropping frames and recording the image data at high image quality. Except for its constitutional details involving sampling number control, the third embodiment is the same in configuration as the image pickup apparatus 1 or 11 shown in FIG. 1 or 2. For that reason, the configuration of the third embodiment will be described below by referring to FIG. 1 or 2 where appropriate.

Figure 4:
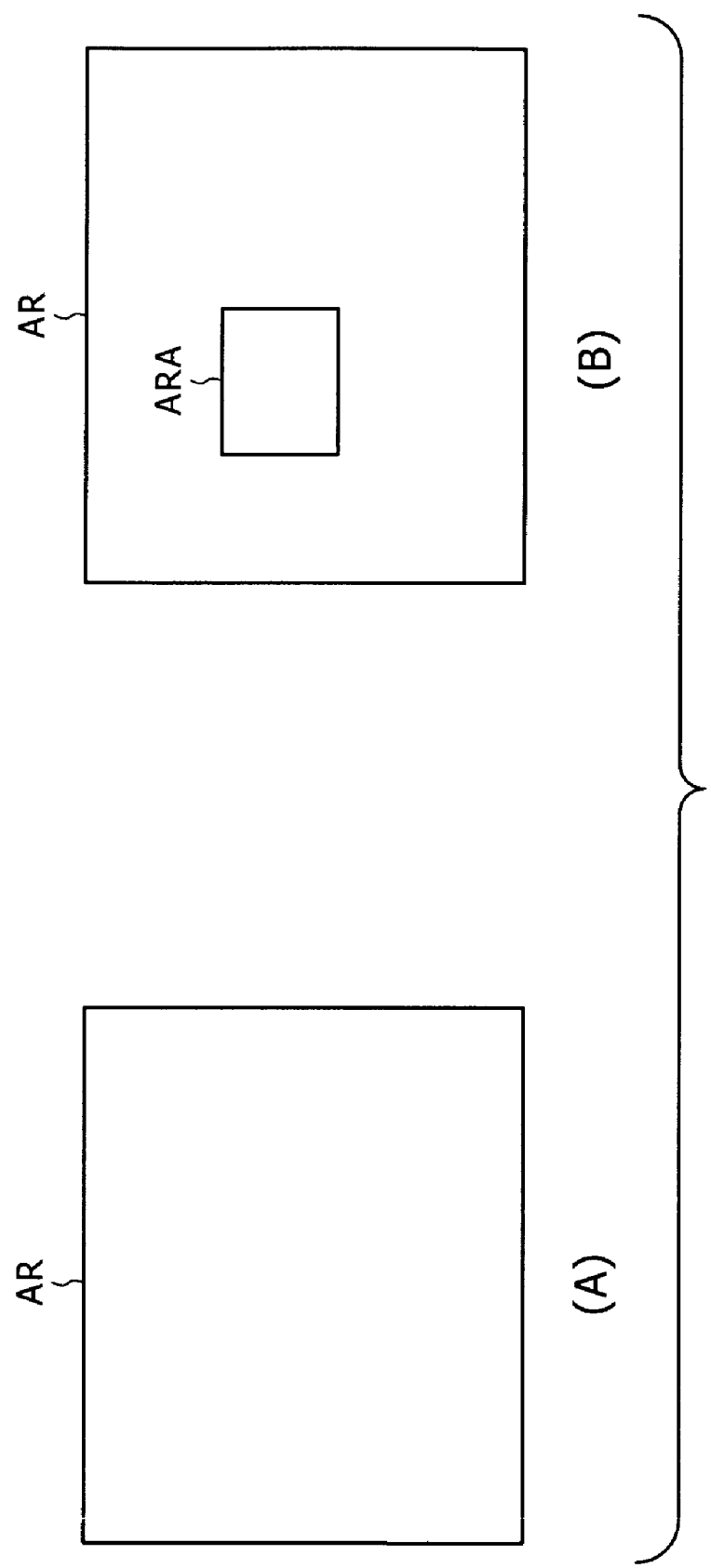
FIG. 4(A) and FIG. 4(B) are schematic views explanatory of an image pickup apparatus practiced as a third embodiment of the present invention.

In the third embodiment, the driving device 6 switches timing signals for output to the image pickup element 3 under control of the control device 9 or 14. As shown in FIG. 4(B) in contrast to FIG. 4(A), that operation extracts a partial area ARA from an effective pixel area AR (capable of outputting image pickup results) of the image pickup element 3. Only the image pickup results from the extracted partial area ARA are selectively output by the image pickup element 3.

Instead of directly varying the processing time TC of the image compression device 8 or 13, the control device 9 or 14 varies the size of the partial area ARA in a manner changing the sampling number of the image pickup results in order to modify the processing time TC of the image compression device 8 or 13. This makes it possible to prevent dropping frames and to compress the image pickup results at the highest possible image quality.

That is, when the processing time TC of the image compression device 8 becomes longer than the charge storage time TE, the control device 9 or 14 reduces the partial area ARA in size to lower the sampling number of image pickup results, thus shortening the processing time TC of the image compression device 8. Conversely, when the processing time TC of the image compression device 8 becomes shorter than the charge storage time TE, the control device 9 or 14 enlarges the partial area ARA in order to boost the sampling number of the image pickup results, whereby the processing time TC of the image compression device 8 is prolonged. If the size of the partial area ARA is found deviating from a user-designated range while the sampling number is being changed to vary the processing time TC, the techniques described above in connection with the first or the second embodiment may be used to prevent dropping frames in place of the sampling number control. The selective output of the image pickup results from the partial area ARA is associated with an image compensation feature of the image pickup apparatus. The third embodiment makes an effective use of its image compensation feature to simplify the entire apparatus configuration.

The third embodiment varies the processing time of the image compression device 8 by changing the sampling number of image pickup results. In so doing, the third embodiment of the present invention provides the same effects as the first or the second embodiment.

(6) Fourth Embodiment

Instead of controlling the sampling number of the image data output by the image pickup element, the fourth embodiment controls the sampling number of the image data input to the image compression device so as to prevent dropping frames and thereby to record the image data at high image quality. Except for details involving sampling number control, the fourth embodiment is the same in configuration as the image pickup apparatus of the third embodiment. For that reason, the configuration of the fourth embodiment will be described below with reference to the setup in FIG. 1 or 2 which is applicable to the third embodiment.

In the image pickup apparatus 1 or 11 of the fourth embodiment, a frame memory is provided on the output side of the analog-to-digital conversion circuit 7. The image data output by the analog-to-digital conversion circuit 7 is stored temporarily in this frame memory. Those addresses in the frame memory from which to retrieve image data are controlled in such a manner as to extract the partial area ARA from the image formed by the image data held in the frame memory. The image data D1 derived from the extracted partial area ARA is selectively read from the frame memory for data compression. In the image pickup apparatus 11 shown in FIG. 2, the frame memory may be constituted by the memory device 12.

The fourth embodiment controls the sampling number of the image data being input to the data compressing means instead of adjusting the sampling number of the image data output by the image pickup element. In this manner, the fourth embodiment provides the same effects as the third embodiment.

(7) Fifth Embodiment

Figure 5:
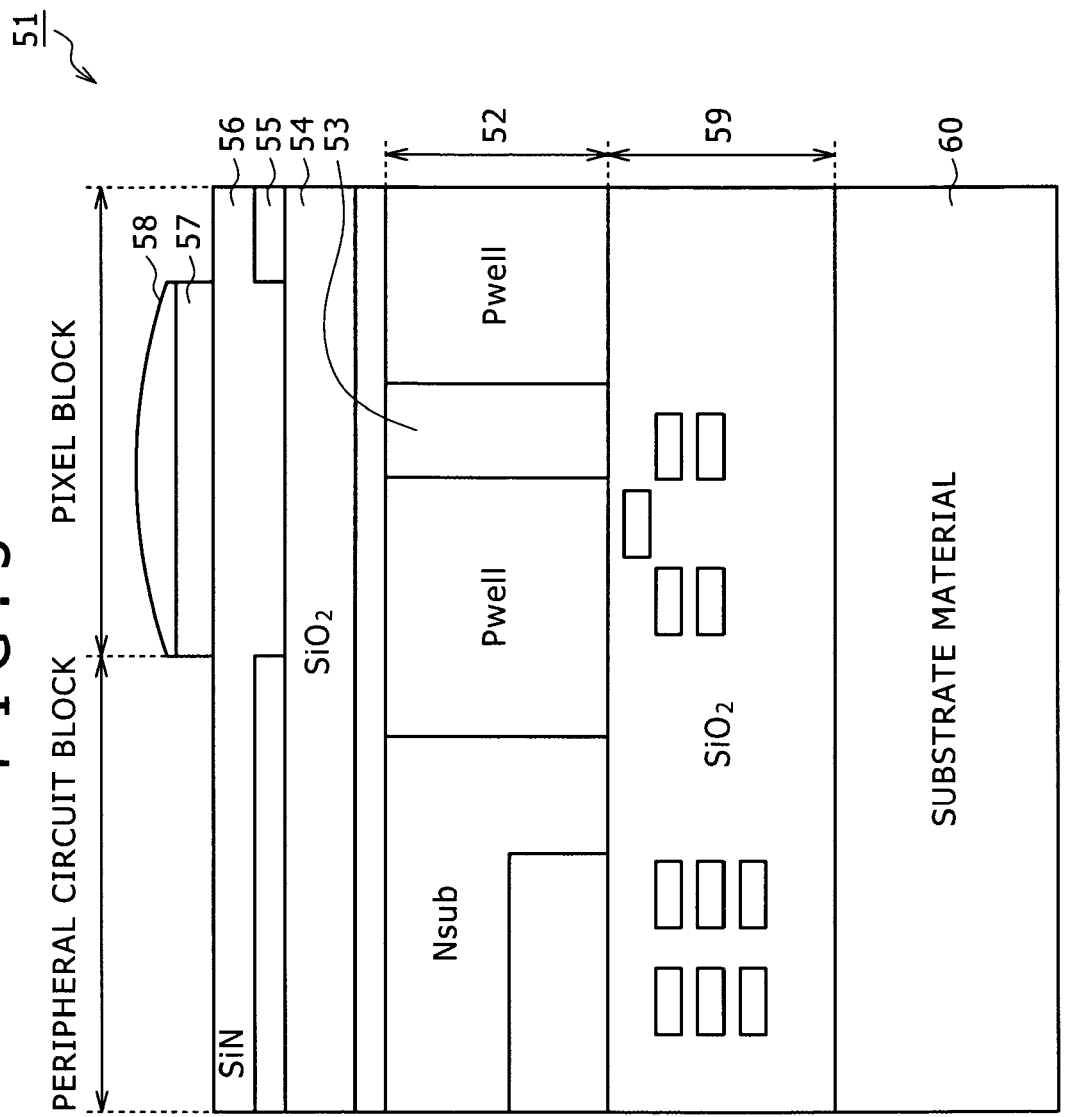
FIG. 5 is a cross-sectional view showing an integrated circuit applied to an image pickup apparatus practiced as a fifth embodiment of the present invention.

FIG. 5 is a cross-sectional view showing an integrated circuit applied to an image pickup apparatus practiced as the fifth embodiment of the present invention. With the fifth embodiment, the integrated circuit constitutes the image pickup apparatus that would serve as the first through the fourth embodiments of the invention.

The integrated circuit 51 is formed by integrating the image pickup element 3 with peripheral circuits. In the image pickup apparatus 1 of the first embodiment, the integrally structured peripheral circuits include the driving device 6, analog-to-digital conversion circuit 7, and image compression device 8. In the image pickup apparatus 11 of the second embodiment, the integrally formed peripheral circuits further include the memory device 12. The same configuration is found in the peripheral circuits of the image pickup apparatus of the third and the fourth embodiments. The overall configuration of the image pickup apparatus is simplified likewise when applied to the fifth embodiment.

An integrated circuit 51 has an image pickup element block formed by pixel blocks arranged in matrix pattern. The image pickup element block constitutes the image pickup element 3. Around the image pickup element block are peripheral circuits that include the driving device 6 and the other components mentioned above. FIG. 5 is a cross-sectional view showing part of the image pickup element block and peripheral circuit block.

In the integrated circuit 51, am element layer 52 is formed by a silicon (Si) layer having a thickness of about 10 to 20 μm. In the element layer 52 of the pixel block are photodiodes 53 for photoelectric conversion in units of pixels. Under the element layer 52 of the peripheral circuit block are circuit elements such as MOSFET's that configure the peripheral circuits.

Above the element layer 52 of the integrated circuit 51 are a silicon oxide ($SiO_2$) film 54, a light shielding film 55, a silicon nitride (SiN) film 56, a color filter 57, and a micro lens segment 58 stacked from the bottom up. Under the element layer 52 are the photodiodes 53 and a wiring layer 59 that wires the circuit elements in the peripheral circuits. Under the wiring layer 59 is a substrate material 60 that supports the entire integrated circuit. In the integrated circuit 51, the wiring layer 59 is furnished opposite to a light-receiving area. This configuration resolves many problems related to the typical setup where the wiring layer is positioned on the light-receiving area side. This boosts the degree of freedom in installing the wiring. The problems associated with the wiring layer being located on the light-receiving area side include a drop in the amount of incident light to each pixel and the phenomenon of cross talks between adjacent pixels.

The above-described configuration in which the wiring layer 59 is formed opposite to the light-receiving area of the integrated circuit 51 allows the thinly-formed semiconductor substrate to be processed from the side of the wiring layer 59, whereby the photodiodes 53 and the circuit elements of the peripheral circuits are initially constructed. Then the wiring layer 59 and substrate material 60 are formed, in that order, on the semiconductor substrate. With the semiconductor substrate turned upside down, the substrate surface is polished by CMP to form the element layer 52, light shielding film 55, silicon nitride (SiN) film 56, color filter 57, and micro lens segment 58 successively.

The image pickup apparatus of the fifth embodiment has the wiring layer 59 formed opposite to the light-receiving area as described. The resulting increase in the degree of freedom in installing the wiring is effectively taken advantage of when the image pickup results of the apparatus are read at high speed. The rapid data readout is carried out by setting up a plurality of channels through which to output parallelly and simultaneously the results of photoelectric conversion from the pixels as the image pickup results. Suppose that the character "r" represents the data rate of the output from each channel and that N denotes the number of channels. In that case, the data rate for the entire image pickup element is given by following expression, $R=N\times r$ whereby the image pickup results can be output at high speed.

The CCD (Charge Coupled Device), a solid-state image pickup element functionally comparable to the CMOS solid-state image pickup element, accommodates up to about eight channels (N=8) for simultaneous and parallel output under wafer process constraints. By contrast, the image pickup element based on the integrated circuit 51 of the fifth embodiment may have the channel count N set for 100 or higher. This makes it possible to output the image pickup results at a significantly higher rate than before.

Figure 6:
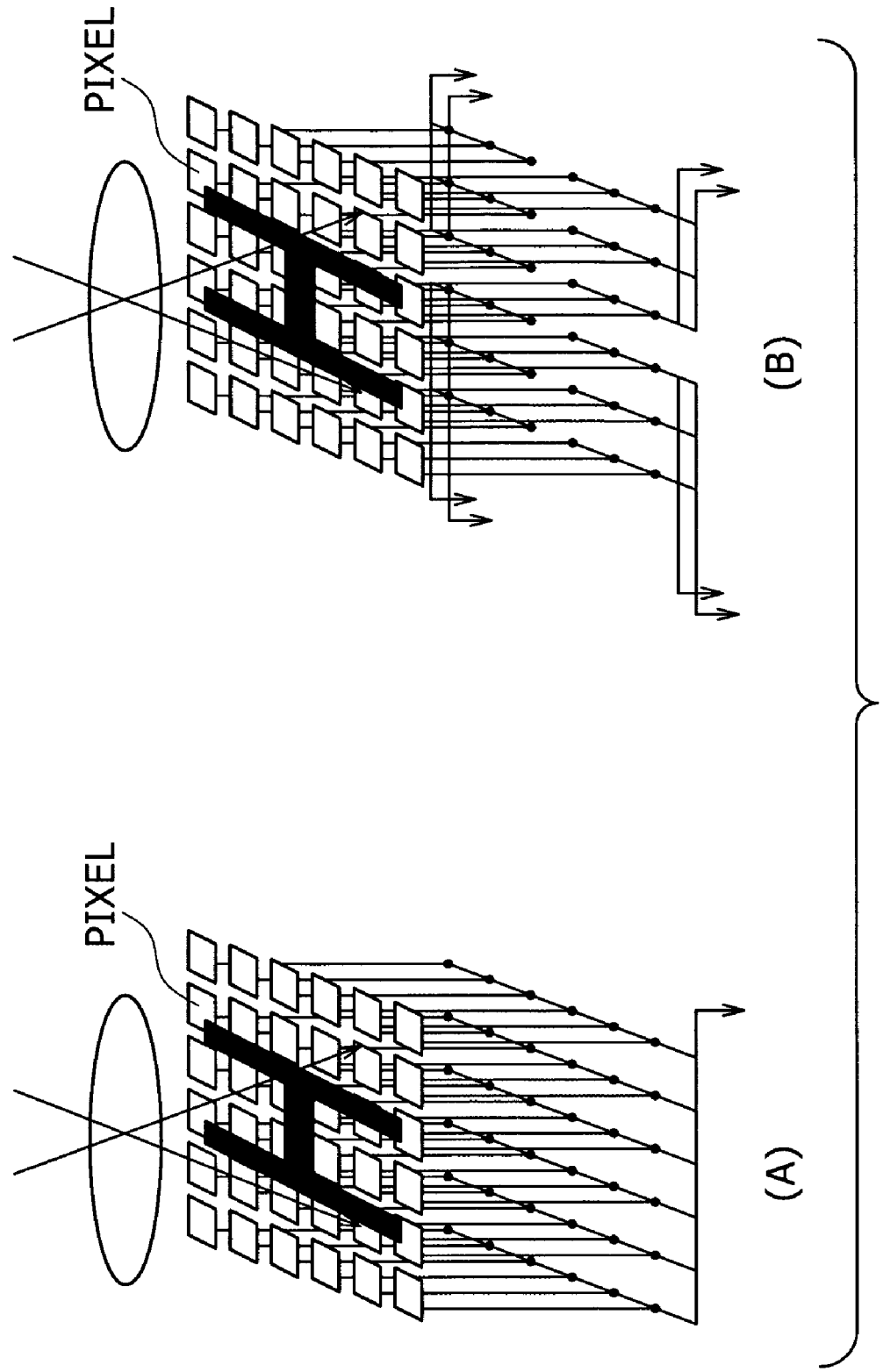
FIG. 6(A) and FIG. 6(B) are schematic views explanatory of how a CCD solid-state image pickup element provides its output through a plurality of channels.

FIG. 6(A) and FIG. 6(B) are schematic views illustrating how image pickup results are output by a CCD solid-state image pickup element. FIG. 6(A) shows a setup where image pickup results are output through a single channel. In this case, the charges stored in the pixels are transferred to vertical transfer registers. From the vertical transfer registers, the stored charges are transferred successively to a horizontal transfer register for consecutive output. FIG. 6(B) shows a setup where image pickup results are output through eight channels. Eight horizontal transfer registers are provided to accommodate the stored charges coming from the vertical transfer registers. From the eight horizontal transfer registers, the stored charges are successively output.

Figure 7:
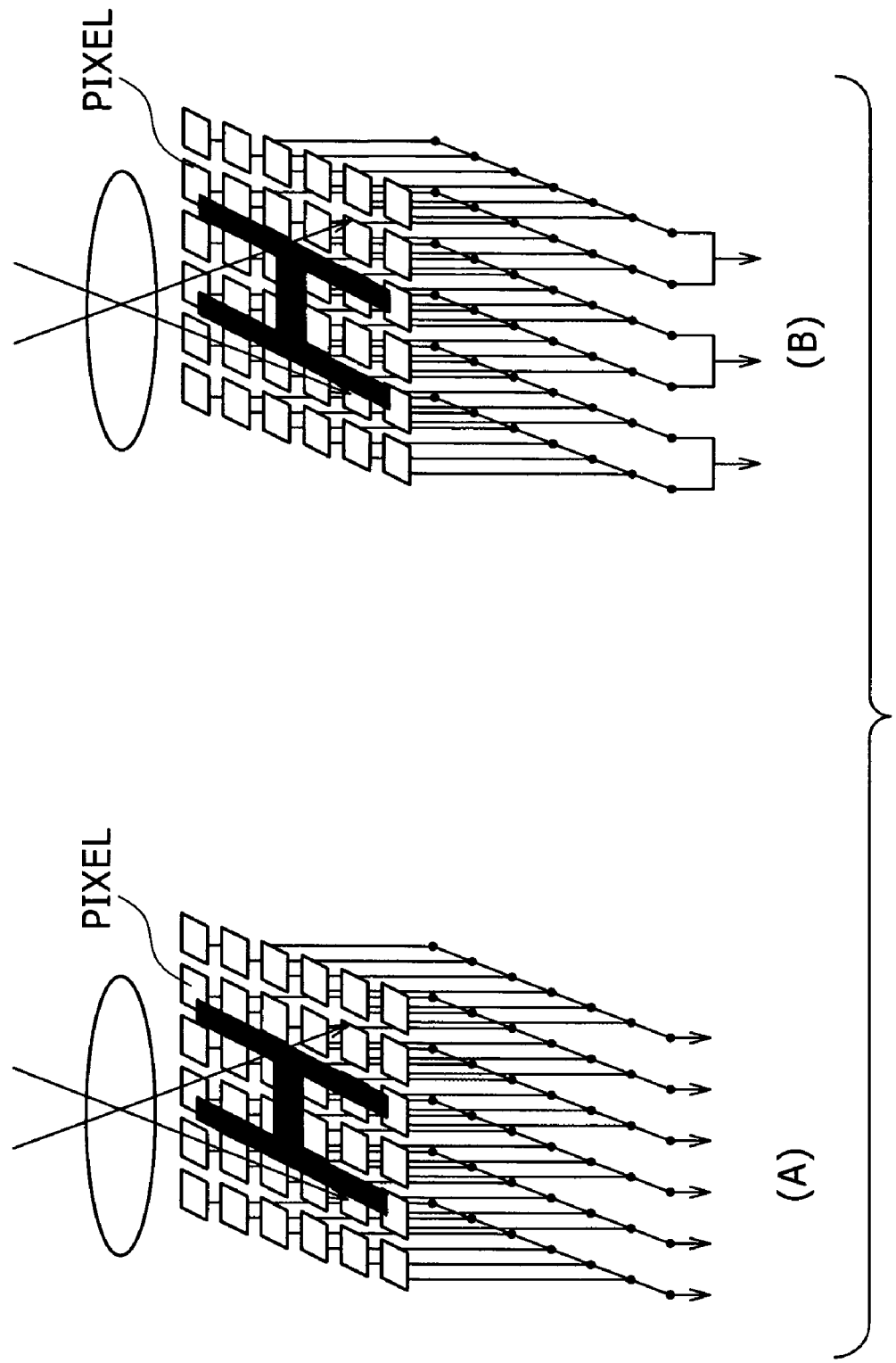
FIG. 7(A) and FIG. 7(B) are another schematic views explanatory of how a CMOS solid-state image pickup element provides its output through a plurality of channels.

FIG. 7(A) and FIG. 7(B) are schematic views depicting how image pickup results are output from a CMOS solid-state image pickup element. FIG. 7(A) shows a setup where the image pickup results from the pixels are output in units of columns. In this case, the image pickup results are output parallelly and simultaneously through as many channels as the number of columns. With the fifth embodiment, the image pickup results are output in units of columns by the setup of FIG. 7(A). The output from each column is subjected to analog-to-digital conversion by as many analog-to-digital conversion circuits as the number of columns, whereby image data is created through a plurality of channels. The image data thus created is compressed in the manner described in connection with the first through the fourth embodiments above. The charge storage time of the image pickup element and the processing time of the image compression device are controlled in accordance with the time it takes to perform the data compression.

The fifth embodiment is arranged to output image pickup results through a plurality of channels as described. This arrangement is intended to acquire the image pickup results reliably at a high frame frequency and to compress the obtained results unfailingly.

Where it is possible to ensure a practically sufficient transfer rate, the image pickup results may be multiplexed for output on a plurality of columns as shown in FIG. 7(B), as opposed to the above-described simultaneous and parallel column-by-column output of image pickup results. In the setup of FIG. 7(B), the image pickup results are shown multiplexed for output on every two columns. In this case, the image pickup results are output through half as many channels as the number of columns.

The above-described configuration of the fifth embodiment allows the image pickup means, the driving circuit of the image pickup means, and the data compressing means to be formed on an integrated circuit. This reduces the entire apparatus in size and simplifies its configuration.

When the wiring layer is formed opposite to the light-receiving area and is positioned to connect the image pickup means with the peripheral circuits, the wiring is laid out with a high degree of freedom. This makes it possible reliably to process the image pickup results acquired at a high frame frequency.

(8) Sixth Embodiment

Figure 8:
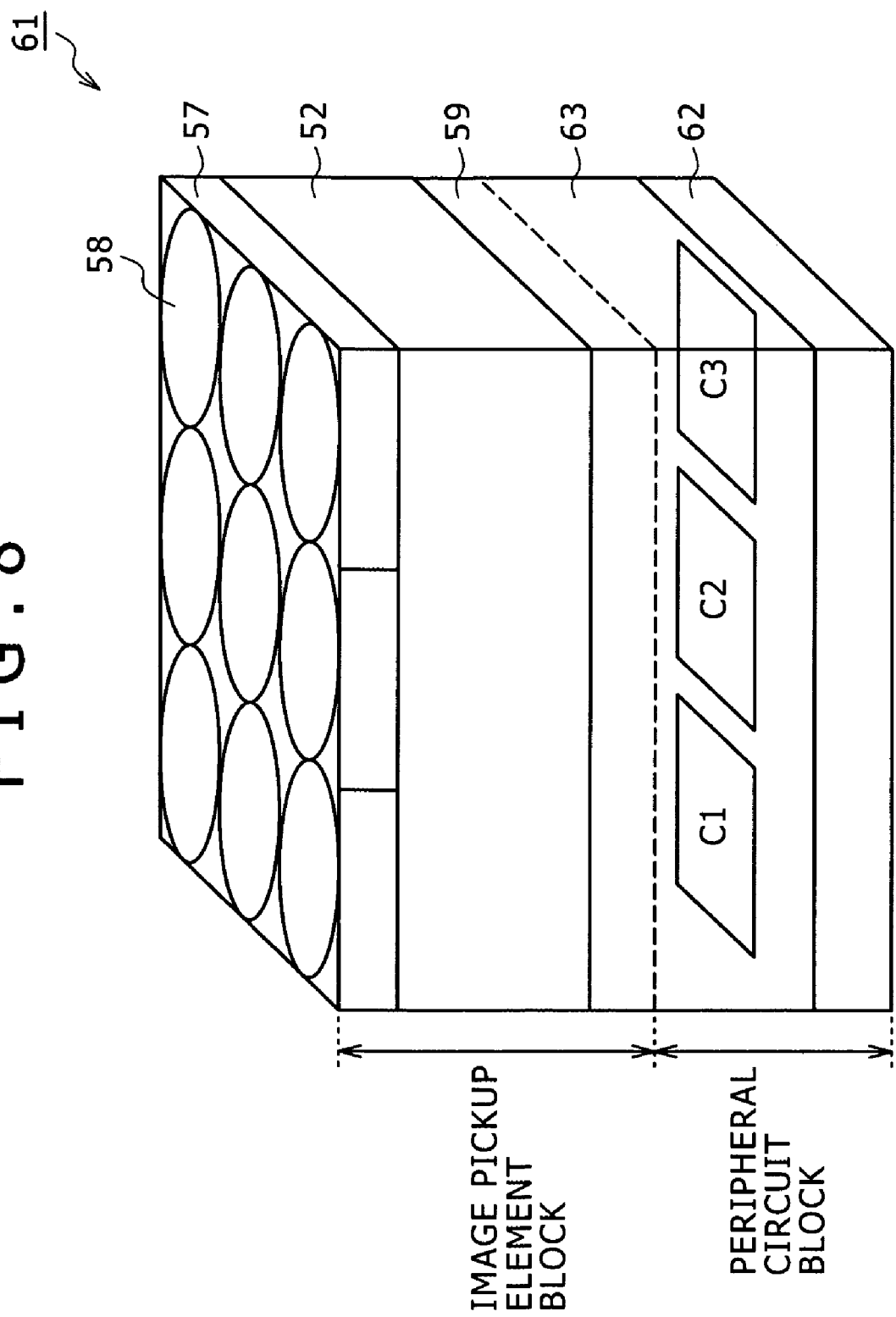
FIG. 8 is a perspective view showing an integrated circuit applied to an image pickup apparatus practiced as a sixth embodiment of the present invention.

FIG. 8 is a perspective view showing part of an integrated circuit applied to an image pickup apparatus practiced as the sixth embodiment of the present invention. The integrated circuit of the sixth embodiment constitutes the image pickup apparatus used in the first through the fourth embodiments. In this integrated circuit 61, the components whose functionally equivalent counterparts are also found in the integrated circuit 51 of the fifth embodiment above are designated by like reference numerals, and their descriptions are omitted where redundant.

The integrated circuit 61 is formed by integrating the image pickup element 3 with the peripheral circuits. The integrally structured peripheral circuits for the first embodiment, as in the case of the image pickup apparatus of the fifth embodiment, include the driving device 6, analog-to-digital conversion circuit 7, and image compression device 8. In the image pickup apparatus 11 of the second embodiment, the integrally formed peripheral circuits further include the memory device 12. The same configuration is found in the peripheral circuits of the image pickup apparatus of the third and the fourth embodiments. The overall configuration of the image pickup apparatus is likewise simplified when applied to the sixth embodiment.

The integrated circuit 61 is formed by having an image pickup element block stacked on the peripheral circuit block. After semiconductor elements constituting the peripheral circuits are formed on a semiconductor substrate 62 by appropriate semiconductor processes, a wiring layer 63 is formed above the semiconductor element to wire them. In the peripheral circuit block, electrodes for connection with the image pickup element block are formed on the wiring layer 63.

As described above in conjunction with the fourth embodiment, the image pickup element block is formed by pixel blocks arranged in matrix pattern. An element layer 52 is formed by a silicon (S1) layer having a thickness of about 10 to 20 μm. In the element layer 52 of the image pickup element block are photodiodes for photoelectric conversion in units of pixels.

Above the element layer 52 of the image pickup element block are a silicon oxide film, a light shielding film, a silicon nitride film, a color filter 57, and a micro lens segment 58 stacked from the bottom up to constitute an image pickup area. A wiring layer 59 is formed under the element layer 52. The peripheral circuit block is located under the wiring layer 59. The wiring layer 63 of the peripheral circuit block is connected to the wiring layer 59 in such a manner that the image pickup element and the peripheral circuits are formed into an integrated circuit structure.

In the integrated circuit 61, the wiring layer 59 is furnished opposite to the light-receiving area. This configuration resolves many problems related to the typical setup where the wiring layer 59 is positioned on the light-receiving area side. This boosts the degree of freedom in installing the wiring. When the peripheral circuit block is integrated with the image pickup element block by way of the wiring layer 59 provided opposite to the light-receiving area, the two blocks can each be formed by a different wafer process before being integrated. This makes it possible to adopt wafer processes that are optimally fit to produce respectively the image pickup element block and the peripheral circuit block, whereby the overall performance of the apparatus is improved.

More specifically, the peripheral circuit block can be formed into a small-sized power-saving chip by miniaturizing the semiconductor elements and reducing the wiring pattern width. However, reducing the pixel size tends to lower the sensitivity of the image pickup element block. Furthermore, the larger the number of furnished pixels, the wider the chip area. Such constraints are taken into consideration when the image pickup element block and peripheral circuit block of the sixth embodiment are integrally formed using different wafer processes. Each of the image pickup element block and the peripheral circuit block is produced by an optimally adapted wafer process in such a manner that the image pickup apparatus has its overall performance appreciably improved.

Where the image pickup element block is formed integrally with the peripheral circuit block by way of the wiring layer 59 formed opposite to the light-receiving area, the integrated circuit 61 is constructed substantially in the same manner as with the fifth embodiment. That is, a thinly-formed semiconductor substrate is first processed into photodiodes on the side of the wiring layer 59. The wiring layer 59 is then formed on the semiconductor substrate before being stacked with the peripheral circuit block produced by a different waver process. Then with the semiconductor substrate turned upside down, the substrate surface is polished by CMP to form the element layer 52, light shielding film, color filter 57, and micro lens segment 58 successively, whereby the integrated circuit 61 is completed.

Figure 9:
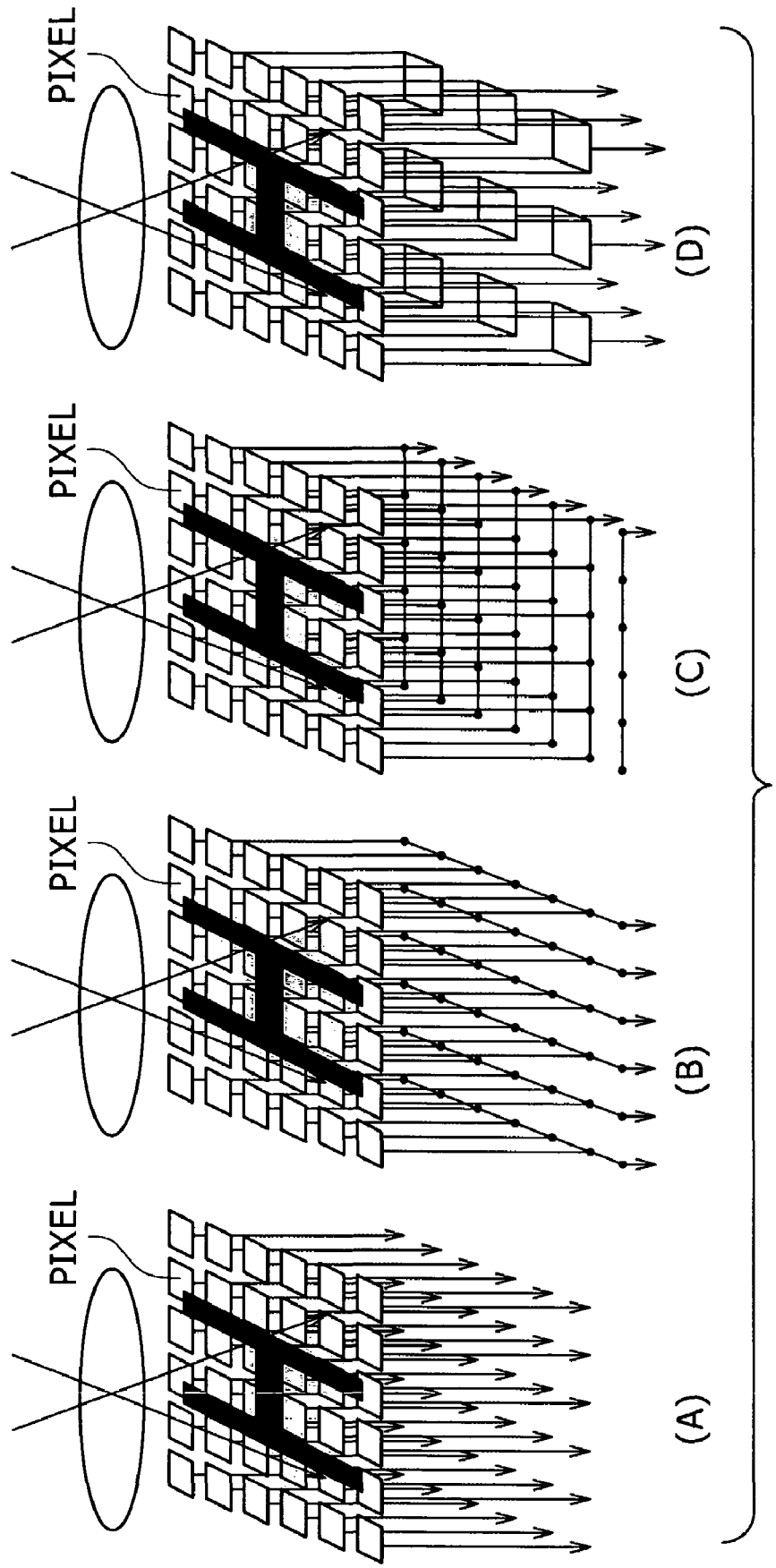
FIG. 9(A), FIG. 9(B), FIG. 9(C), and FIG. 9(D) are schematic views explanatory of how image pickup results acquired by the image pickup apparatus of FIG. 8 are output.

When the integrated circuit 61 is constructed by stacking the components on the semiconductor substrate using different wafer processes, the image pickup element 3 has the output of each pixel channeled into the peripheral circuits for analog-to-digital conversion to image data D1, as shown in FIG. 9(A). In this manner, the sixth embodiment outputs image pickup results on a simultaneously parallel basis in units of pixels at high speed.

The simultaneously parallel output of image pickup results may be effected in units of columns as shown in FIG. 9(B), in units of lines as shown in FIG. 9(C), or in units of blocks each composed of a plurality of pixels arrayed horizontally and vertically as shown in FIG. 9(D). The image pickup results output simultaneously and parallelly in units of columns, lines, or blocks are submitted per unit to an analog-to-digital conversion circuit for conversion into image data.

The peripheral circuits admit such image pickup results at high speed, obtained therefrom the image data D1 in a simultaneously parallel manner, and rearrange the data D1 for compression. In the peripheral circuits, the image compression device 8 or 13 for data compression process is formed by three channels of processing circuits C1 through C3 as shown in FIG. 8. The image data is divided into three parts and fed to the three channels of processing circuits C1 through C3 which carry out data compression through simultaneously parallel processing at high speed.

The processing time TC required for data compression is varied by selectively driving the processing circuits C1 through C3 for simultaneously parallel processing and by switching the divisions of the image data D1 in accordance with the selective driving of the processing circuits.

In the sixth embodiment, the peripheral circuits are formed under the wiring layer of the image pickup element block. This structure forms the image pickup element and the peripheral circuits into an integrated circuit with an appreciably higher degree of freedom. When image pickup results are acquired at a high frame frequency for recording and transmission, the configuration of the sixth embodiment permits reliable compression of the image pickup results.

For the sixth embodiment, the image pickup element block and the peripheral circuit block are produced by different wafer processes. Because each block is formed by an optimally designed process, the overall performance of the apparatus is improved.

Where image data is compressed in simultaneously parallel processing through a plurality of channels, the number of channels may be changed so as to vary the time required for data compression. This arrangement also provides the same effects as those brought about by the preceding embodiments.

(9) Seventh Embodiment

The seventh embodiment inherits the configuration described above in connection with the sixth embodiment. As such, the seventh embodiment outputs the image pickup results from pixels through each of the channels in a sequence that corresponds to the data compression process.

In one example, the data compression process is effected as line-based wavelet transformation that involves the handling of a two-dimensional filter arrangement having a tap input with a predetermined number of lines. In carrying out the line-based wavelet transformation, the seventh embodiment outputs image pickup results in units of lines which are in turn arranged into groups of multiple lines, as shown in FIG. 9(C). The image pickup results are thus output simultaneously and parallelly through a plurality of channels in units of lines. Where the output is effected in units of two lines, the image pickup results of the pixels are output by use of the connection setup shown in FIG. 7(B). After image data is created by processing the line-by-line image pickup results, the image data is compressed. The image pickup results of each line are then output in a sequence that corresponds to the order in which the data compression has been performed. In this manner, the process of line-based wavelet transformation brings about successive output per line of the image pickup results from pixels in a horizontal direction corresponding to the sequence of raster scanning.

Another example of the data compression process involves having the lines for line-based wavelet transformation set in the column direction of the image pickup element. In this case, as shown in FIG. 9(B), image pickup results are output in units of columns which are in turn arranged into groups of multiple columns. The image pickup results are then output successively in a top-to-bottom sequence.

A further example of the data compression process involves having motion compensation and orthogonal transformation carried out in units of macro blocks as in MPEG applications. In this case, as shown in FIG. 9(D), image pickup results are output in units of blocks each formed by a plurality of pixels arrayed vertically and horizontally. The blocks are set for macro blocks in terms of size. The image pickup results of each block are then output in a sequence corresponding to the data compression process regarding the block in question.

In the manner described above, the seventh embodiment makes effective use of the configuration in which the peripheral circuits are formed under the wiring layer, in order to compress image pickup results at high speed. The image pickup results obtained at a high frame frequency are thus processed unfailingly.

The image compression device 8 or 13 successively assigns the blocks each having multiple pixels arrayed horizontally and vertically, to the processing channels C1 through C3 for simultaneous and parallel data compression. In carrying out the data compression in units of macro blocks, the image compression device assigns the macro blocks cyclically to the processing circuits C1 through C3 for data compression in the sequence of raster scanning, as shown in FIG. 10 in contrast to the setup of FIG. 8.

In the data compression process of line-based wavelet transformation performed in units of lines as described above in reference to FIG. 7(B) and FIG. 9(C), the images constituted by image pickup results are divided into vertically equal parts that are assigned to the processing circuits C1 through C3 for data compression. In the data compression process of line-based wavelet transformation carried out in units of columns as described in reference to FIG. 9(B), the images constituted by image pickup results are divided into horizontally equal parts that are assigned to the processing circuits C1 through C3 for data compression.

In the manner described above, when the speed of data compression is varied by changing the number of channels for parallel data compression, the seventh embodiment switches allotments of the data to each channel in accordance with the changed channel count.

As described, the seventh embodiment makes effective use of the configuration in which the peripheral circuits are formed under the wiring layer when compressing image pickup results at high speed and thereby processing reliably the image pickup results acquired at a high frame frequency. To achieve this, the embodiment has the image pickup results output in simultaneously parallel through a plurality of channels. Specifically, the image pickup results are output in any one of the following sequences: in the sequence corresponding to the order in which data is compressed by the data compressing means in units of columns; in the sequence corresponding to the order in which data is compressed by the data compressing means in units of lines; or in the sequence corresponding to the order in which data is compressed by the data compressing means in units of blocks each made up of a plurality of pixels arrayed horizontally and vertically.

(10) Other Embodiments

The embodiments above were each shown utilizing a particular technique or techniques for varying the speed at which to compress data. This invention is not limited to this, any of these techniques may be used in a suitable combination or combinations to change the speed of data compression processing.

Given the configuration in which the processing time of the data compressing means and the charge storage time of the image pickup means are varied in accordance with the processing time of the data compressing means, the second embodiment was shown to store temporarily the image pickup results output by the image pickup means in accordance with the processing time of the data compressing means, before getting the results compressed by the data compressing means. This invention is not limited to this, if the image pickup results can be compressed following acquisition at a frame frequency that is sufficiently high in practice, it is possible to omit the arrangements for varying the charge storage time of the image pickup means or the processing time of the data compressing means.

In describing the foregoing embodiments, the peripheral circuit block made up of the driving circuit, analog-to-digital conversion circuits and image compression device and supplemented with the memory device was shown formed integrally with the image pickup element block to constitute an integrated circuit. This invention is not limited to this, part or all of the control block may be formed into an integrated circuit configuration in addition to the above constitution.

In connection with the embodiments above, the charge storage time was shown compared with the processing time for control over the relevant components. This invention is not limited to this, the frame period may be compared with the processing time for effecting control over the components.

With regard to the foregoing embodiments, the CMOS solid-state image pickup element was shown adopted as the image pickup means for control over charge storage time whereby the frame period of image pickup results is varied. This invention is not limited to this, the frame period may be varied while the charge storage time is kept constant. Alternatively, the CMOS solid-state image pickup element may be replaced by the CCD solid-sate image pickup element for a wide range of applications.

INDUSTRIAL APPLICABILITY

The present invention relates to an image pickup apparatus, an image pickup element, and a method for controlling the image pickup apparatus. Illustratively, the invention may apply to a video camera for recording image pickup results constituting moving pictures, an electronic still camera, and a monitoring apparatus.

The invention claimed is:

1. An image pickup apparatus comprising:
   image pickup means for outputting image pickup results through activation of a driving circuit;
   data compressing means for compressing the image pickup results output by said image pickup means before outputting the compressed image pickup results; and
   controlling means for varying the charge storage time or the frame period of said image pickup means or the processing time of said data compressing means in accordance with the processing time required by said data compressing means for compressing the image pickup results,
   wherein the image pickup means includes a light receiving area having photoelectric conversion devices laid out in a matrix pattern, the light receiving area being connected to the data compressing means or the driving circuit by a wiring layer formed opposite the light receiving area, and
   the image pickup results output by the image pickup means include pixels output based on a sequence in which the data compressing means processes the pixels, the pixels being in units of blocks arrayed horizontally and vertically.

2. The image pickup apparatus according to claim 1, wherein if said processing time becomes longer than said charge storage time or said frame period, said controlling means controls said image pickup means in a manner prolonging said charge storage time or said frame period.

3. The image pickup apparatus according to claim 1, wherein if said processing time becomes longer than said charge storage time or said frame period, said controlling means controls said data compression means in a manner shortening said processing time.

4. The image pickup apparatus according to claim 1, further comprising:
storing means for temporarily storing the image pickup results output by said image pickup means, before outputting the temporarily stored image pickup results to said data compressing means,
wherein said controlling means controls said storing means and said data compressing means in operation so that the image pickup results output by said image pickup means are temporarily stored by said storing means before being compressed by said data compressing means.

5. The image pickup apparatus according to claim 1, wherein the processing time of said data compressing means is varied with clocks switched for said data compressing means.

6. The image pickup apparatus according to claim 1, wherein said image pickup means selectively outputs the image pickup results from a partial area within an effective image pickup area, and
said processing time of said data compressing means is varied with changes in a sampling number of the image pickup results processed by said data compressing means in response to changes in the size of said partial area.

7. The image pickup apparatus according to claim 1, wherein said data compressing means selectively acquires and processes the image pickup results derived from a partial area within an effective image pickup area, said image pickup results being output by said image pickup means by way of storing means, and
said processing time of said data compressing means is varied with changes in a sampling number of said image pickup results processed by said data compressing means in response to changes in the size of said partial area.

8. The image pickup apparatus according to claim 1, wherein said image pickup means is formed integrally with peripheral circuits including at least said driving circuit and said data compressing means, constituting an integrated circuit.

9. The image pickup apparatus according to claim 8, wherein said peripheral circuits are formed under said wiring layer.

10. The image pickup apparatus according to claim 9, wherein the image pickup results of said image pickup means are output in a simultaneously parallel manner through a plurality of channels.

11. The image pickup apparatus according to claim 10, wherein the simultaneously parallel output of said image pickup results through said plurality of channels is constituted by the image pickup results derived from pixels in a manner corresponding to a sequence in which said data compressing means processes said pixels in units of columns.

12. The image pickup apparatus according to claim 10, wherein the simultaneously parallel output of said image pickup results through said plurality of channels is constituted by the image pickup results derived from pixels in a manner corresponding to a sequence in which said data compressing means processes said pixels in units of lines.

13. The image pickup apparatus according to claim 9, wherein said part having said photoelectric conversion devices laid out in matrix pattern to represent pixels is formed by a wafer creation process different from the one by which said peripheral circuits are formed.

14. The image pickup apparatus according to claim 13,
wherein said data compressing means compresses said image pickup results through motion compensation and orthogonal transformation executed in units of macro blocks, before outputting the compressed image pickup results, and
said image pickup means outputs the image pickup results from said macro blocks in a sequence corresponding to the order in which said image pickup results are compressed.

15. The image pickup apparatus according to claim 13, wherein said image pickup means submits said image pickup results to a plurality of channels in a simultaneously parallel manner for analog-to-digital conversion by an analog-to-digital conversion circuit furnished per channel, before outputting the converted results.

16. The image pickup apparatus according to claim 13,
wherein said image pickup means submits said image pickup results to a plurality of channels each formed by a macro block for analog-to-digital conversion by an analog-to-digital conversion furnished per channel, before outputting the converted results,
said data compressing means compresses said image pickup results through motion compensation and orthogonal transformation executed in units of said macro blocks, before outputting the compressed image pickup results, and
said image pickup means outputs the image pickup results from said macro blocks in a sequence corresponding to the order in which said image pickup results are compressed.

17. The image pickup apparatus according to claim 1, wherein said data compressing means compresses said image pickup results parallelly through a plurality of channels, and
said processing time of said data compressing means is varied by changing the number of said channels in accordance with the processing of said data compressing means.

18. The image pickup apparatus according to claim 17, wherein said data compressing means performs data compression by successively assigning to each of said channels blocks which are each formed by a plurality of pixels arrayed horizontally and vertically and which constitute an image represented by said image pickup results.

19. The image pickup apparatus according to claim 1,
wherein said blocks are constituted by macro blocks, and
said data compressing means compresses said image pickup results through motion compensation and orthogonal transformation executed in units of said macro blocks, before outputting the compressed image pickup results.

20. The image pickup apparatus according to claim 1, wherein said image pickup means submits said image pickup results to an analog-to-digital conversion circuit furnished per said unit for analog-to-digital conversion on a unit-by-unit basis, before outputting the converted image pickup results.

21. The image pickup apparatus according to claim 1,
wherein said blocks are constituted by macro blocks,
said data compressing means compresses said image pickup results through motion compensation and orthogonal transformation executed in units of said macro blocks, before outputting the compressed image pickup results, and
said image pickup means submits said image pickup results to an analog-to-digital conversion circuit furnished per said macro block for successive analog-to-digital conversion, before outputting the converted image pickup results.

22. An image pickup element comprising:

image pickup means for outputting image pickup results through activation of a driving circuit; and data compressing means for compressing the image pickup results output by said image pickup means before outputting the compressed image pickup results, said image pickup means and said data compressing means being formed integrally, wherein part or all of controlling means varies the charge storage time or the frame period of said image pickup means or the processing time of said data compressing means in accordance with the processing time required by said data compressing means for compressing the image pickup results, wherein the image pickup means includes a light receiving area having photoelectric conversion devices laid out in a matrix pattern, the light receiving area being connected to the data compressing means or the driving circuit by a wiring layer formed opposite the light receiving area, and the image pickup results output by the image pickup means include pixels output based on a sequence in which the data compressing means processes the pixels, the pixels being in units of blocks arrayed horizontally and vertically.

23. A method for controlling an image pickup apparatus comprising:

outputting image pickup results through activation of a driving circuit; and compressing the image pickup results before outputting the compressed image pickup results, varying the charge storage time or the frame period of the image pickup results or the processing time of the compressing in accordance with the processing time required for compressing the image pickup results, wherein the image pickup results are output by a light receiving area having photoelectric conversion devices laid out in a matrix pattern, the light receiving area being connected to a device that performs the compressing or the driving circuit by a wiring layer formed opposite the light receiving area, and the image pickup results include pixels output based on a sequence in which the pixels are compressed, the pixels being in units of blocks arrayed horizontally and vertically.

24. An image pickup apparatus comprising:

an image pickup device configured to output image pickup results through activation of a driving circuit;

a data compression device configured to compress the image pickup results output by said image pickup element before outputting the compressed image pickup results; and a control device configured to vary the charge storage time or the frame period of said image pickup element or the processing time of said data compression device in accordance with the processing time required by said data compression device for compressing the image pickup results, wherein the image pickup device includes a light receiving area having photoelectric conversion devices laid out in a matrix pattern, the light receiving area being connected to the data compression device or the driving circuit by a wiring layer formed opposite the light receiving area, and the image pickup results output by the image pickup device include pixels output based on a sequence in which the data compression device processes the pixels, the pixels being in units of blocks arrayed horizontally and vertically.

* * * * *